United States Patent [19]
Koemtzopoulos et al.

[11] Patent Number: 6,071,573
[45] Date of Patent: Jun. 6, 2000

[54] PROCESS FOR PRECOATING PLASMA CVD REACTORS

[75] Inventors: C. Robert Koemtzopoulos, Hayward; Felix Kozakevich, Sunnyvale, both of Calif.

[73] Assignee: Lam Research Corporation, Fremont, Calif.

[21] Appl. No.: 09/001,220

[22] Filed: Dec. 30, 1997

[51] Int. Cl.[7] .................................. H05H 1/24; B05D 7/22
[52] U.S. Cl. ...................... 427/578; 427/579; 427/237; 427/238; 427/239; 438/905
[58] Field of Search ..................... 427/578, 579, 427/237, 238, 239; 438/905

[56] References Cited

U.S. PATENT DOCUMENTS

| | | |
|---|---|---|
| 4,340,462 | 7/1982 | Koch . |
| 4,401,054 | 8/1983 | Matsuo et al. . |
| 4,650,698 | 3/1987 | Moriya et al. ........................... 427/237 |
| 4,657,616 | 4/1987 | Benzing et al. . |
| 4,786,352 | 11/1988 | Benzing . |
| 4,816,113 | 3/1989 | Yamazaki . |
| 4,842,683 | 6/1989 | Cheng et al. . |
| 4,857,139 | 8/1989 | Tashiro et al. . |
| 4,902,934 | 2/1990 | Miyamura et al. . |
| 4,948,458 | 8/1990 | Ogle . |
| 5,006,192 | 4/1991 | Deguchi . |
| 5,129,958 | 7/1992 | Nagashima et al. . |
| 5,158,644 | 10/1992 | Cheung et al. . |
| 5,200,232 | 4/1993 | Tappan et al. . |
| 5,207,836 | 5/1993 | Chang . |
| 5,356,478 | 10/1994 | Chen et al. . |
| 5,482,749 | 1/1996 | Telford et al. ........................... 427/578 |
| 5,571,576 | 11/1996 | Qian et al. .............................. 427/574 |
| 5,589,233 | 12/1996 | Law et al. ............................... 427/579 |
| 5,647,953 | 7/1997 | Williams et al. . |

FOREIGN PATENT DOCUMENTS

| | | |
|---|---|---|
| 57-201016 | 12/1982 | Japan . |
| 61-250185 | 11/1986 | Japan . |
| 62-214175 | 9/1987 | Japan . |
| 63-267430 | 4/1988 | Japan . |
| 3-62520 | 3/1992 | Japan . |

OTHER PUBLICATIONS

High Density Plasma Deposition and Deep Submicron Gap Fill with Low Dielectric Constant of SiOF Films, L.Q. Qian et al., (Feb. 21–22, 1995) DUMIC Conference, pp. 50–56.

Comparison of PECVD F–TEOS Films and High Density Plasma SiOF Films, D. Schuchmann et al., (Feb. 21–22, 1995) DUMIC Conference, pp. 97–103.

Preparation of SiOF Films with Low Dielectric Constant by ECR Plasma CVD, T. Fukada et al., (Feb. 21–22, 1995), DUMIC Conference, pp. 43–49.

An Evaluation of Fluorine Doped PETEOS on Gap Fill Ability and Film Characterization, K. Hewes et al., (Feb. 21–22, 1995) DUMIC Conference.

Dual Frequency Plasma CVD Fluorosilicate Glass Water Absorption and Stability, M. Shapiro et al., (Feb. 21–22, 1995), DUMIC Conference, pp. 118–123.

Water–Absorption Mechanisms of F–doped PECVD SiO with Low–Dielectric Constant, H. Miyajima et al., (Feb. 21–22, 1995), DUMIC Conference, pp. 391–393.

Silicon Processing for the VLSI Era, Wolf et al., Lithography 1: Optical Resist Materials and Process Technology, pp. 438–441.

Lee et al, Han'guk Chaelyo Hakhoechi, 7(10) Abstract, 1997.

*Primary Examiner*—Roy V. King
*Attorney, Agent, or Firm*—Burns, Doane, Swecker & Mathis, L.L.P.

[57] ABSTRACT

A method for precoating interior surfaces of a plasma CVD reactor after removal of built-up fluorinated silicon oxide residues by in-situ reactor cleaning. The deposition gas mixture includes F, Si, O and optional Ar. The interior surfaces can be precoated with fluorinated silicon oxide using a deposition gas mixture which includes 80 to 200 sccm $SiF_4$ and 150 to 400 sccm $O_2$ supplied to the reactor in a gas flow ratio of $O_2:SiF_4$ of 1.4 to 3.2. The precoated film can be deposited at a high deposition rate to maintain high throughput in the reactor while providing a precoat film having low compressive stress and thus high film adhesion and low particle generation during subsequent substrate processing in the reactor.

17 Claims, 3 Drawing Sheets

PROCESS FOR PRECOATING PLASMA CVD REACTORS

FIELD OF THE INVENTION

The invention relates to a process of applying a coating to interior surfaces of plasma CVD reactors. More particularly, the precoating process can be applied following an in-situ cleaning treatment of a plasma CVD reactor used to deposit SiOF films on substrates such as semiconductor wafers.

BACKGROUND OF THE INVENTION

Chemical vapor deposition (CVD) reactors are used to form various thin films in a semiconductor integrated circuit. Such CVD reactors can form thin films such as $SiO_2$, $Si_3N_4$, Si or the like with high purity and high quality. In the CVD process of forming a thin film, one or more semiconductor substrates are arranged in a reactor and raw material to be deposited is supplied in the form of gaseous constituents so that gaseous molecules are thermally disassociated and combined in the gas and on a surface of the substrates so as to form a thin film. A plasma-enhanced CVD apparatus utilizes a plasma reaction at a relatively low temperature in order to form a thin film. The plasma CVD apparatus includes a process chamber consisting of a plasma generating chamber which may be separate from or part of a reaction chamber, a gas introduction system, and an exhaust system.

Plasma-enhanced CVD reactors are disclosed in U.S. Pat. No. 4,401,504 and commonly-owned U.S. Pat. No. 5,200,232. Plasma is generated in such an apparatus by a high density microwave discharge through electron-cyclotron resonance (ECR). A substrate table is provided in the reaction chamber, and plasma generated in the plasma formation chamber passes through a plasma extracting orifice so as to form a plasma stream in the reaction chamber. The substrate table may include a radiofrequency (RF) biasing component to apply an RF bias to the substrate and a cooling mechanism in order to prevent a rise in temperature of the substrate due to the plasma action.

A plasma apparatus using high density ECR for various processes such as deposition, etching and sputtering to manufacture semiconductor components is disclosed in U.S. Pat. No. 4,902,934. Such a plasma apparatus includes an electrostatic chuck (ESC) for holding a substrate (such as a silicon wafer) in good thermal contact and in a vertical orientation. The chuck can also be provided with cooling and heating capabilities. In general, such reaction chambers can be operated under vacuum conditions, and the plasma generation chamber can be enclosed by walls which are water-cooled. Other types of reactors in which deposition can be carried out include parallel plate reactors and high density transformer coupled plasma (TCP™), also called inductively coupled plasma (ICP), reactors of the type disclosed in commonly owned U.S. Pat. Nos. 4,340,462 and 4,948,458.

In semiconductor processing, devices are being built with smaller wiring pitches and larger interconnect resistances. In order to reduce delays in critical speed paths, it has been proposed to embed low dielectric constant material between adjacent metal lines or lower the dielectric constant of the intermetal dielectric material by adding fluorine thereto. A paper presented at the Feb. 21–22, 1995 DUMIC Conference by L. Qian et al., entitled "High Density Plasma Deposition and Deep Submicron Gap Fill with Low Dielectric Constant SiOF Films" describes deposition of up to 10 atomic % fluorine-containing moisture resistant SiOF films on a silicon sample at room temperature using high density plasma. This paper states that fluorine in the film can be reduced by adding hydrogen to the $SiF_4+O_2+Ar$ deposition gas chemistry, the film had a dielectric constant of 3.7, and the refractive index was lowest for deposition conditions where the $SiF_4:SiF_4+O_2$ gas flow ratio was 0.29.

Another paper presented at the DUMIC Conference is by D. Schuchmann et al., entitled "Comparison of PECVD F-TEOS Films and High Density Plasma SiOF Films." This paper mentions that fluorinated TEOS films have been used for gap filling and compares such films to films deposited by inductively coupled high density plasma (HDP) using $SiF_4+O_2+Ar$. The HDP films were found to have better moisture and thermal stability than the F-TEOS films.

Other papers presented at the DUMIC Conference include "Preparation of SiOF Films with Low Dielectric Constant by ECR Plasma CVD" by T. Fukada et al., "An Evaluation of Fluorine Doped PETEOS on Gap Fill Ability and Film Characterization" by K. Hewes et al., "Dual Frequency Plasma CVD Fluorosilicate Glass Water Absorption and Stability" by M. Shapiro et al., and "Water-absorption mechanisms of F-doped PECVD $SiO_2$ with Low-Dielectric Constant" by H. Miyajima et al. Of these, Fukada discloses that SiOF films deposited by RF biased ECR plasma are superior to SOG and $TEOS-O_3$ films, the SiOF films providing excellent planarization and sub half micron gap filling without voids. Moreover, according to Fukada, the dielectric constant of SiOF films can be reduced from 4.0 to 3.2 by increasing the $SiF_4/(SiF_4+SiH_4)$ gas flow ratio in an RF-biased ECR plasma CVD process using $SiF_4$, $SiH_4$, Ar and $O_2$ gas reactants ($O_2/(SiF_4+SiH_4)=1.6$) and a substrate held on a water cooled electrostatic chuck. Fukada also discloses that the deposition rate was 5500 A/min under the condition of $SiF_4$, Ar and $O_2$ without $SiH_4$. Hewes discloses CVD of fluorosilicate glass films from TEOS, $O_2$ and $C_2F_6$ introduced into a reaction chamber by a showerhead gas mixer. Shapiro discloses that ULSI device speed can be increased by reducing capacitance of the interlevel insulator such as by adding fluorine to $SiO_x$ films such as by using a fluorocarbon gas as the fluorine precursor in TEOS CVD. Miyajima discloses that water absorption of F-doped $SiO_2$ films containing more than 4% F is a serious problem because it causes degradation of device reliability and film adhesion properties. Miyajima also discloses that the resistance to water absorption is lower for films deposited by parallel plate plasma CVD compared to high density helicon-wave plasma using TEOS, $O_2$ and $CF_4$ as deposition gases.

During processing of semiconductor wafers it is conventional to carry out periodic in-situ cleaning of plasma CVD reactors. U.S. Pat. No. 5,129,958 discloses a method for cleaning a CVD deposition chamber in a semiconductor wafer processing apparatus wherein fluorine residues in the chamber, left from a prior fluorine plasma cleaning step, are contacted with one or more reducing gases such as silane ($SiH_4$), ammonia, hydrogen, phosphine ($PH_3$), diborine ($B_2H_6$), and arsine ($AsH_3$). The fluorine residues are contacted by the reducing gas or gases for ten seconds to five minutes or longer and the reducing gas or gases are introduced into the chamber at a rate of 100 sccm to 500 sccm or higher while maintaining the temperature in the chamber at 250–500° C. In an example, the chamber was maintained at 1–20 Torr during the reaction between the reducing gas or gases and the fluorine residues or the pressure can range from $10^{-3}$ Torr to 100 Torr during the reaction. Another technique for cleaning and conditioning interior surfaces of plasma CVD reactors is disclosed in commonly owned U.S.

Pat. No. 5,647,953, the subject matter of which is hereby incorporated by reference.

Other techniques for cleaning plasma reaction chambers are disclosed in commonly owned U.S. Pat. No. 5,356,478; in U.S. Pat. Nos. 4,657,616; 4,786,352; 4,816,113; 4,842,683, 4,857,139; 5,006,192; 5,129,958; 5,158,644 and 5,207,836 and Japanese Laid-Open Patent Publication Nos. 57-201016; 61-250185, 62-214175, 63-267430 and 3-62520. For instance, in order to remove $SiO_x$ deposits, a fluorine-containing gas energized into a plasma has been used to clean interior surfaces of the chamber. Fluorine residues remaining after the reactor cleaning can be removed by passing a reducing gas such as hydrogen ($H_2$), silane ($SiH_4$), ammonia ($NH_4$), phosphine ($PH_3$), biborine ($B_2H_6$) or arsine ($AsH_3$) through the reactor.

There is a need in the semiconductor processing industry for a plasma CVD precoat process which minimizes particle contamination and/or provides process repeatability during deposition of SiOF films on semiconductor substrates.

SUMMARY OF THE INVENTION

The invention provides a process for depositing a precoating on interior surfaces of a plasma CVD process chamber wherein semiconductor substrates are processed. The process includes energizing a fluorine-containing deposition gas mixture and forming a plasma containing the deposition gas, contacting interior surfaces of the chamber with the plasma deposition gas and depositing a fluorinated silicon dioxide (SiOF) film on the interior surfaces.

According to one embodiment of the invention, the deposition gas includes a silicon-containing gas and an oxygen-containing gas with or without additional gases such as argon. Increased deposition rates and/or lower compressive stress in the deposited precoat film can be achieved, however, by reducing or eliminating argon from the deposition gas mixture.

The silicon-containing and fluorine-containing gases can be supplied as separate gases but preferably are combined as a single gas such as $SiF_4$. The oxygen-containing gas can be supplied as an oxygen-bearing precursor such as TEOS but preferably is $O_2$ and/or $H_2O$, $H_2O_2$, $O_3$ or mixture thereof.

According to a preferred embodiment, the deposition gas includes $SiF_4$ and $O_2$ with a ratio of $O_2$:$SiF_4$ being 1.4 or above in order to provide a precoat film having a compressive stress below 200 MPa and/or a refractive index below 1.5, preferably below 1.45. By maintaining the $O_2$:$SiF_4$ gas flow ratio within a desirable range, it is possible to provide a precoat film having improved adhesion and minimal tendency to cause flaking and/or particle generation which could adversely affect the subsequently processed semiconductor substrates.

DETAILED DESCRIPTION OF THE PREFERRED EMBODIMENTS

The invention provides a new and improved method of conditioning the interior surfaces of a plasma CVD reactor prior to processing of substrates such as semiconductor wafers or flat panel displays.

The method is particularly effective in conditioning plasma enhanced CVD ("PECVD") reactors such as ECR process chambers having a plasma generating chamber and a plasma reaction chamber or parallel-plate or TCP™ plasma reactors wherein the plasma is generated and one or more substrates are processed in a single process chamber. Examples of CVD reactors are disclosed in commonly owned U.S. Pat. Nos. 4,340,462; 4,948,458 and 5,200,232, the disclosures of which are hereby incorporated by reference.

Figure 1:
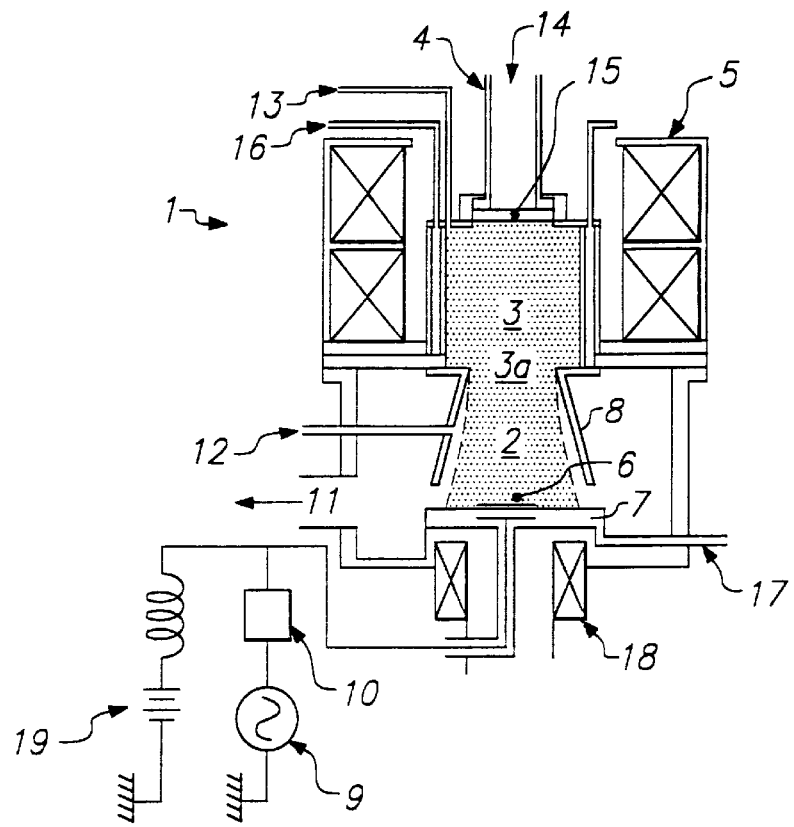
FIG. 1 is a schematic view of a high density plasma ECR reactor which can be used to carry out the process according to the invention.

FIG. 1 shows an ECR reactor 1 which can process a substrate with a high density plasma. The reactor includes a reaction chamber 2 wherein a substrate is subjected to treatment with a plasma gas. In order to generate the high density plasma, the reactor includes a plasma generating chamber 3 wherein a high density plasma is generated by the combination of microwave energy transmitted through microwave guide 4 and magnetic energy generated by electromagnetic coils 5. The high density plasma can be generated from a suitable gas or gas mixture such as oxygen and/or argon and an ion beam is extracted from the plasma chamber through orifice 3a. If desired, the orifice 3a can have the same diameter as the chamber 3. A substrate 6 is supported on a substrate support 7 such as an electrostatic chuck having a substrate temperature controlling mechanism associated therewith.

The high density plasma generated in chamber 3 can be confined within horn 8 by electromagnetic coils 18 and directed to the substrate 6 by applying an RF bias to the substrate by means of an RF source 9 and associated circuitry 10 for impedance matching, etc. The reaction chamber 2 is evacuated by a suitable vacuum arrangement represented generally by the evacuation port 11. In order to introduce one or more silicon and/or fluorine containing reactants into the high density plasma, the horn 8 can include one or more gas injection arrangements such as gas distributing rings on the inner periphery thereof whereby reactants such as $SiH_4$ and $SiF_4$ can be introduced into the high density plasma. The reactant or reactants can be supplied through one or more passages represented generally at 12. In order to produce a plasma in plasma generating chamber 3, oxygen and argon can be introduced into the plasma generating chamber 3 by one or more passages represented generally at 13.

Microwave energy represented by arrow 14 travels through dielectric window 15 and enters the plasma generating chamber 3, the walls of which are water cooled by water supply conduit 17. Electromagnetic coils 18 below substrate holder 7 can be used for shaping the magnetic field in the vicinity of the substrate 6. A DC power source 19 provides power to the substrate holder 7 for electrostatically clamping substrate 6.

Figure 2:
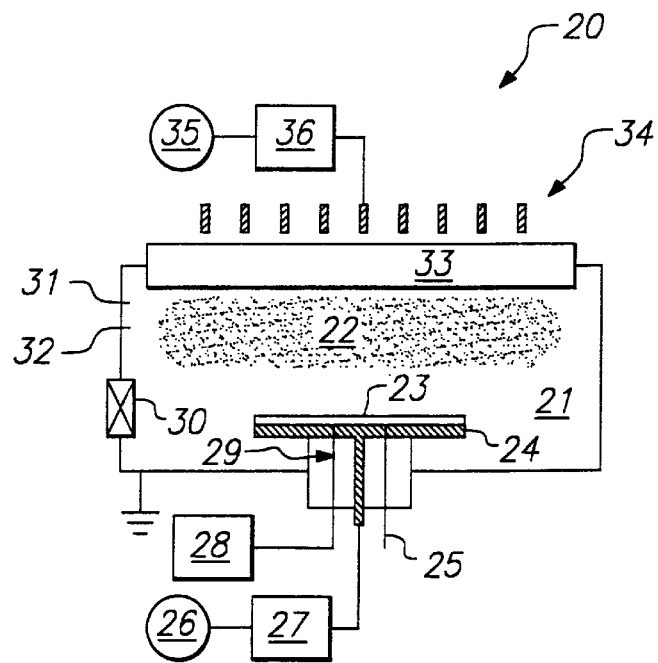
FIG. 2 is a schematic of a high density plasma TCP™ reactor which can be used to carry out the process according to the invention.

FIG. 2 shows a TCP™ reactor 20 which can process substrates with high density plasma. The reactor includes a process chamber 21 in which plasma 22 is generated adjacent substrate 23. The substrate is supported on water cooled substrate support 24 and temperature control of the substrate is achieved by supplying helium gas through conduit 25 to a space between the substrate and the substrate support. The substrate support can comprise an aluminum electrode or a ceramic material having a buried electrode therein, the electrode being powered by an RF source 26 and associated circuitry 27 for providing RF matching, etc. The temperature of the substrate during processing thereof is monitored by temperature monitoring equipment 28 attached to temperature probe 29. A similar temperature monitoring arrangement can also be used in the ECR reactor shown in FIG. 1.

In order to provide a vacuum in chamber 21, a turbo pump is connected to outlet port 30 and a pressure control valve can be used to maintain the desired vacuum pressure. Process gases such as oxygen Ar, $SiF_4$, etc. can be supplied into the chamber by conduits 31, 32 which feed the reactant gases to a gas distribution ring extending around the underside of dielectric window 33. Alternatively, the process gases can be supplied through a dielectric showerhead window or other suitable gas distribution system. An inductive energy source such as an antenna in the form of a spiral TCP™ coil 34 located outside the chamber in the vicinity of the window is supplied RF power by RF source 35 and associated circuitry 36 for impedance matching, etc. When a substrate is processed in the chamber, the RF source 35 supplies the TCP™ coil 34 with RF current at 13.56 MHz and the RF source 26 supplies the lower electrode with RF current at 400 kHz.

The invention provides a conditioning treatment wherein a precoat film can be deposited at a high deposition rate to maintain high throughput in the reactor during processing of substrates such as semiconductor wafers. The wafers can have various sizes such as 4, 6, 8, or 12 inch diameters. The precoat process is also useful for conditioning plasma CVD reactors which process other types of substrates such as flat panel displays.

In processing semiconductor substrates wherein a series of substrates are individually coated with undoped silicon dioxide films, it is conventional to carry out an in-situ cleaning process to remove film deposits on interior surfaces of the plasma CVD reactor. For instance, the reactor may be cleaned in-situ with an RF-powered plasma such as a plasma based on $NF_3$. The in-situ cleaning typically occurs after a certain number of substrates are processed. After the cleaning process, residual fluorine on the interior surfaces of the reactor could pose a problem to subsequent deposition of silicon dioxide on the substrates. In semiconductor substrate processing wherein substrates are coated with a fluorine doped silicon dioxide film, such residual fluorine is not a problem since the precoat process of the present invention deposits a fluorinated silicon oxide film on the interior surfaces of the reactor. As such, it is not necessary to carry out additional steps for purposes of conditioning the interior surfaces of the reactor to eliminate the residual fluorine problem.

The precoat deposition process according to the invention provides a precoat which minimizes particles in the reactor and also conditions the interior surfaces so as to minimize the effects of the prior in-situ cleaning process on the first substrate processed following the precoat process. For instance, by selecting the precoat deposition gas chemistry in accordance with the invention, the precoat film can be deposited so as to have a low film stress thus making it possible to minimize particle generation in the reactor and essentially eliminate the effects of the cleaning process on subsequently processed substrates.

According to the invention, the precoating process is carried out using a deposition gas chemistry suitable for providing a fluorinated silicon oxide film on the interior surfaces of the plasma CVD reactor. The interior surfaces can be of ceramic materials such as alumina, anodized coatings, silicon nitride, etc., metals such as aluminum, stainless steel, etc., quartz and other dielectric materials. According to a preferred embodiment, the gases introduced into the reactor include $SiF_4$ and oxygen with or without additional gases such as argon. For example, $SiF_4$ can be provided at a gas flow rate of 80 to 200 sccm and pure oxygen can be provided at a flow rate of 150 to 400 sccm. The precoat film can be deposited in any desired thickness. As an example, the precoat thickness can be less than 5 $\mu$m, preferably 2000 Å to 2.0 $\mu$m.

In order to maintain high throughput in the reactor, it is desirable to deposit the precoat film at a high deposition rate. However, it has been found that too high a deposition rate can lead to flaking and particle generation due to high compressive stresses in the deposited precoat film. According to the invention it is possible to avoid such high compressive stresses in the deposited precoat film while maintaining high deposition rates. In particular, it has unexpectedly been discovered that adjustment of the $O_2/SiF_4$ gas flow ratio and/or reduction or elimination of argon surprisingly allows high deposition rates to be achieved while maintaining the compressive stress of the deposited precoat film below a desired level.

Figure 3:
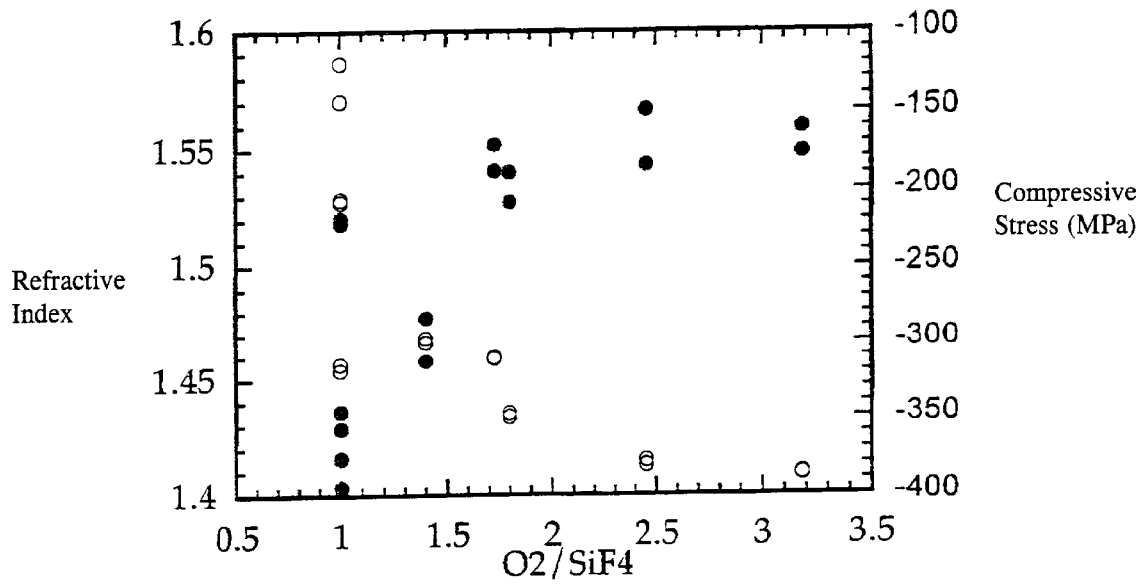
FIG. 3 is a graph showing the effects of the $O_2$/$SiF_4$ gas flow ratio on refractive index of the deposited precoat film (the mean value of the refractive index based on measurements at 49 points is represented by open circles with units shown on the left side of the graph) and compressive stress of the deposited precoat film (represented by closed circles with units shown on the right side of the graph in MPa)
Figure 4:
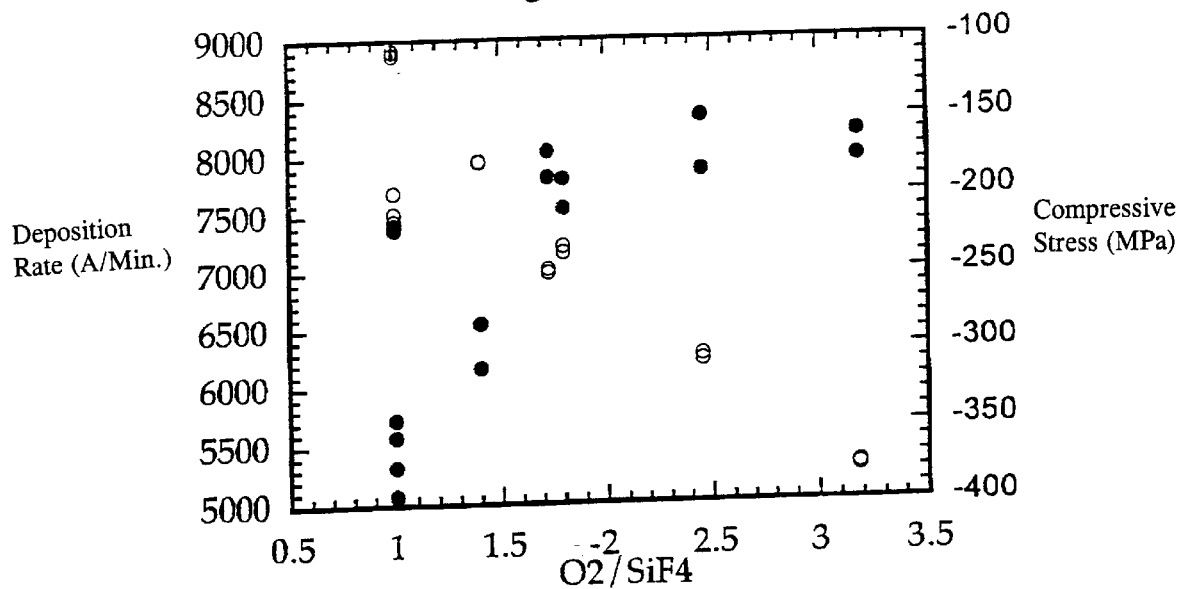
FIG. 4 is a graph showing the effects of the $O_2$/$SiF_4$ gas flow ratio on deposition rate of the deposited precoat film (represented by open circles with units shown on the left side of the graph in A/min) and compressive stress of the deposited precoat film (represented by closed circles with units shown on the right side of the graph in MPa)

According to the present invention, increase in the precoat deposition rate while maintaining a low compressive stress in the deposited precoat film can be achieved by adjusting the $O_2/SiF_4$ gas flow ratio. For instance, by maintaining the $O_2/SiF_4$ gas flow ratio above 1.4, it is possible to significantly improve particle performance and film repeatability for subsequently processed substrates. The effects of varying the $O_2/SiF_4$ gas flow ratio on the film stress/refractive index are shown in FIG. 3 wherein it can be seen that when the ratio is above 1.4 it is possible to maintain the film stress at values of about 200 MPa and below while achieving a refractive index below 1.5, preferably below about 1.45. A preferred gas flow ratio is in the range of 1.7 to 2.5. The effects of varying the $O_2/SiF_4$ gas flow ratio on the film stress/deposition rate are shown in FIG. 4 wherein it can be seen that when the gas flow ratio is above 1.4 it is possible to maintain the film stress at values of about 200 MPa and below while achieving deposition rates of about 5000 to 7000 Å/min.

The refractive index of the deposited precoat film corresponds to the fluorine content in the deposited film, i.e. lower values of refractive index corresponding to higher fluorine contents in the film. In general, it is desirable to maintain the fluorine content in the film below 15 atomic %. When carrying out the process of the invention using an $O_2/SiF_4$ gas flow ratio of 1.7, it is possible to deposit precoat films having a refractive index of about 1.43 to 1.45 which may correspond to a fluorine content of about 5 to 10 at % and the compressive stress of the precoat films is less than about 200 MPa. During subsequent deposition of fluorinated silicon oxide films on substrates processed in the reactor, the films typically have a slightly lower refractive index of about 1.42 to 1.43.

Figure 5:
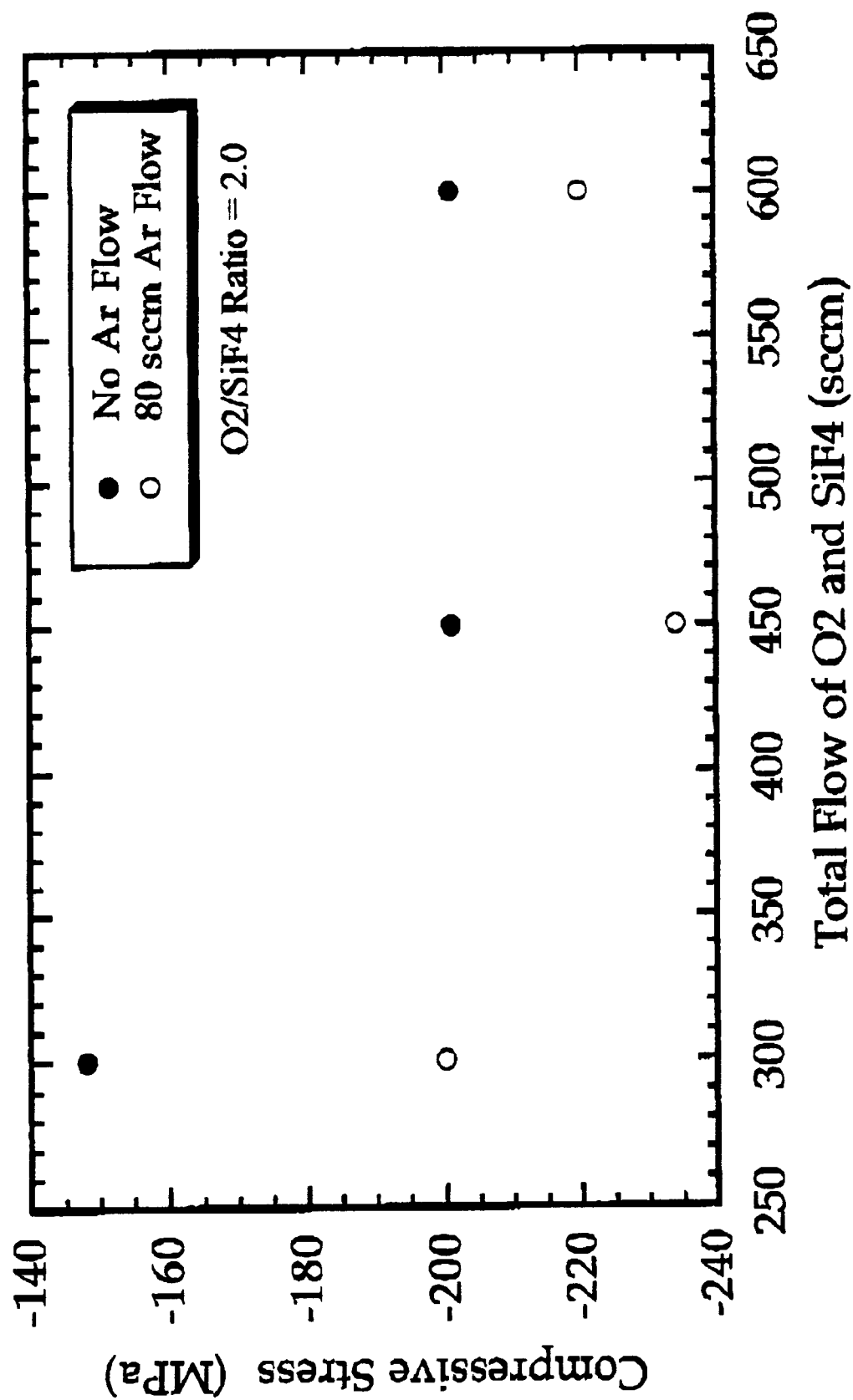
FIG. 5 is a graph of compressive stress versus total $O_2$+$SiF_4$ gas flow using an $O_2$/$SiF_4$ gas flow ratio of 2.0 wherein the open circles represent the deposition gas mixture containing 80 sccm Ar and the solid circles represent the Ar-free gas mixture.

The precoat film produced according to the invention desirably has properties similar to the films that are deposited during processing of the substrates. It has been found that by eliminating argon in the precoat process, it is possible to decrease the film stress and thus reduce the risk of flaking on the reactor interior surfaces such as reactor walls which otherwise could cause problems in subsequent substrate processing. The elimination of argon in the precoat process also allows the reactor pressure to be decreased and achieve higher deposition rates during the precoat process. Such results can be seen from FIG. 5 which shows that addition of Ar increases the precoat film stress by about 20 to 50 MPa. Accordingly, while high deposition rates and low compressive stress in the precoat films can be achieved by using a deposition gas chemistry free of Ar, amounts of Ar such as up to 100 sccm Ar can be incorporated in the deposition gas while maintaining the compressive stress and deposition rate at desirable levels.

In a precoat process wherein silane ($SiH_4$) is used instead of $SiF_4$, the precoat films have different properties than obtainable according to the present invention and the precoat processes using silane produce precoat films having different properties than those produced during subsequent substrate processing. Compared to the prior precoat process using silane, the precoat process according to the invention provides surprisingly improved increase in the deposition rate at which the precoat is deposited and improved particle performance of the reactor. For instance, during extended process runs of several thousand wafers, the precoat process according to the invention showed less than 0.1 added particles per $cm^2$. Also, the use of a fluorine doped precoat improved the performance of subsequent gap fill processing in that the gap fill process deposition rate was increased and stabilized. Moreover, thickness uniformity of the processed substrates was improved to less than 2% (1σ) based on 1 μm thick films and measurements at 49 points on the substrate. Such improvements were achieved wafer-to-wafer, lot-to-lot and chamber-to-chamber for fluorine doped silicon oxide deposition. In addition, since $SiF_4$ does not contain any hydrogen, formation of water in the reactor is negligible. In this way, $H_2O$ and OH are not incorporated into the fluorine doped films during the deposition process. Such benefits along with the improved throughput of the reactor make the precoat process in accordance with the invention highly attractive from a production standpoint.

According to a preferred embodiment of the invention, the precoat process is carried out by optimizing the $O_2/SiF_4$ gas flow ratio and eliminating argon from the precoat process gases. An especially preferred precoating gas includes $SiF_4$ and pure oxygen wherein the gas flow ratio of $O_2:SiF_4$ is 1.7 to 2.5. As an example, the precoating gas can include 100 sccm $SiF_4$ and 170 sccm $O_2$. As a result, it is possible to decrease compressive stress of the precoat, increase rate of deposition and/or improve precoat adhesion on the reactor interior surfaces. With respect to film stress, the precoat can be provided with a film stress less than 200 MPa compressive. Although it is not necessary, the precoat traps residual F on interior surfaces, especially those located in the vicinity of the substrate support. Interior surfaces in more remote portions of the chamber may or may not be coated to any significant extent in the precoating step. The precoating step can be carried out for a time sufficient to provide a fluorinated silicon oxide coating having a thickness such as 2000 Å to 2 μm.

In plasma cleaning a CVD reactor of the type disclosed in U.S. Pat. No. 5,200,232, the plasma cleaning step is carried out while maintaining the chamber walls and components of the reactor such as a horn, substrate support and shield surrounding the substrate support at ambient or at a temperature less than 100° C. For instance, various surfaces within the chamber can be water cooled aluminum surfaces, the walls being cooled by water at ambient temperature and the horn, shield and substrate support being cooled by water heated to 60° C. Thus, during the precoating step the interior chamber surfaces are maintained in a temperature range similar to that during subsequent semiconductor substrate processing.

After accumulated build-up of fluorinated $SiO_2$ on interior surfaces of a plasma CVD reactor, reduction of particle contamination and improved adhesion of a deposited precoat fluorinated $SiO_2$ film on interior surfaces of a plasma process chamber having water cooled aluminum surfaces can be achieved by the following process.

After a series of substrates such as silicon semiconductor wafers are processed by depositing fluorinated $SiO_2$ thereon in an ECR chamber, the ECR chamber is evacuated to a pressure of 400–600 mTorr, filled with pure $NF_3$ gas injected at 600 to 800 sccm and the $NF_3$ gas is energized into a plasma while maintaining chamber walls at ambient and the horn and shield surrounding the substrate support at 60° C. The plasma removes 1 μm of fluorinated $SiO_2$ from the interior surfaces in about 20–60 seconds. Cleaning of interior surfaces including water cooled parts such as a horn, substrate support and surrounding shield is then carried out for about 2–6 minutes depending on cleaning process factors such as RF power, $NF_3$ gas flow rate, reactor pressure, etc.

After the in-situ cleaning is completed, the $NF_3$ flow is terminated and $SiF_4$, $O_2$ and 0 to 100 sccm Ar are injected at desirable flow rates while maintaining the reactor at a pressure of ≦10 mTorr. The $SiF_4$, $O_2$ and optional Ar gases are energized for about 1½ minutes to form a plasma which precoats interior surfaces of the reactor with a fluorinated $SiO_2$ film having a thickness of about 1 to 2 μm. During the precoating step the walls are maintained at any desired temperature such as at ambient and the horn and shield can be maintained at higher temperatures such as around 60° C. This precoating step is effective in trapping residual F and other cleaning byproducts in a fluorinated silicon dioxide coating and/or sticking particles not removed in the cleaning step to the reactor interior surfaces.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process of depositing a fluorinated silicon oxide precoat on interior reactor surfaces of a plasma CVD reactor wherein substrates are processed, the process comprising:

precoating the interior surfaces with fluorinated silicon oxide, the precoating being carried out by introducing a deposition gas mixture comprising $SiF_4$ and oxygen into the reactor, activating one or more components of the deposition gas mixture into a plasma state, and contacting the interior surfaces with the plasma until the interior surfaces are coated with a fluorinated silicon oxide film, the $SiF_4$ and oxygen being supplied into the reactor at a gas flow ratio of $O_2:SiF_4$ of at least 1.7, the gas flow ratio being effective for maintaining compressive stress of the fluorinated silicon oxide film at 200 MPa or below, wherein the fluorinated silicon oxide film is deposited at a rate of at least 5000 Å/min.

2. The method of claim 1, wherein the deposition gas mixture consists essentially of $SiF_4$ and oxygen.

3. The method of claim 2, wherein the oxygen in the deposition gas mixture is pure oxygen.

4. The method of claim 1, wherein the reactor is evacuated during the precoating step to a pressure below 100 mTorr.

5. The method of claim 1, wherein prior to the precoating, the process further comprises in-situ cleaning the reactor to remove built-up deposits generated during prior deposition of fluorinated silicon oxide films on one or more semiconductor substrates.

6. The method of claim 1, wherein the precoating step is carried out until the fluorinated silicon oxide film has a thickness of 2000 Å to 2 μm.

7. The method of claim 1, wherein the reactor comprises an ECR reactor and includes water-cooled aluminum chamber walls and at least one water-cooled aluminum component maintained at a temperature of less than 100° C. during the precoating process, the component being coated with the fluorinated silicon oxide film during the precoating process.

8. The method of claim 1, wherein the precoating process is followed by introducing a semiconductor substrate into the reactor and depositing a fluorinated silicon oxide layer on the substrate.

9. The method of claim 1, wherein the deposition gas mixture is introduced into a plasma generating chamber of an ECR reactor and the precoating process coats interior surfaces in a substrate treatment chamber located adjacent the plasma generating chamber.

10. The method of claim 1, wherein the deposition gas includes 0 to 100 sccm argon.

11. The method of claim 1, wherein the fluorinated silicon oxide film has a refractive index of less than 1.5.

12. The method of claim 1, wherein the fluorinated silicon oxide film has a fluorine content of less than 15 atomic % fluorine.

13. The method of claim 1, wherein the reactor includes an antenna which forms the plasma by inductively coupling radio frequency energy into the reactor.

14. A process of depositing a fluorinated silicon oxide precoat on interior reactor surfaces of a plasma CVD reactor wherein substrates are processed, the process comprising:

precoating the interior surfaces with fluorinated silicon oxide, the precoating being carried out by introducing a deposition gas mixture comprising $SiF_1$ and oxygen into the reactor, activating one or more components of the deposition gas mixture into a plasma state, and contacting the interior surfaces with the plasma until the interior surfaces are coated with a fluorinated silicon oxide film, the $SiF_4$ and oxygen being supplied into the reactor at a gas flow ratio of $O_2:SiF_4$ of at least 1.7, the gas flow ratio being effective for maintaining compressive stress of the fluorinated silicon oxide film at 200 MPa or below, the deposition gas mixture being free of argon.

15. A process of depositing a fluorinated silicon oxide precoat on interior reactor surfaces of a plasma CVD reactor wherein substrates are processed, the process comprising:

precoating the interior surfaces with fluorinated silicon oxide, the precoating being carried out by introducing a deposition gas mixture comprising $SiF_4$ and oxygen into the reactor, activating one or more components of the deposition gas mixture into a plasma state, and contacting the interior surfaces with the plasma until the interior surfaces are coated with a fluorinated silicon oxide film, the $SiF_4$ and oxygen being supplied into the reactor at a gas flow ratio effective for maintaining compressive stress of the fluorinated silicon oxide film at 200 MPa or below, the oxygen in the deposition gas being pure oxygen and the oxygen and $SiF_4$ being supplied to the reactor in a gas flow ratio of $O_2:SiF_4$ of at least 1.7, wherein the fluorinated silicon oxide film is deposited at a rate of at least 5000 Å/min.

16. A process of depositing a fluorinated silicon oxide precoat on interior reactor surfaces of a plasma CVD reactor wherein substrates are processed, the process comprising:

precoating the interior surfaces with fluorinated silicon oxide, the precoating being carried out by introducing a deposition gas mixture comprising $SiF_4$ and oxygen into the reactor, activating one or more components of the deposition gas mixture into a plasma state, and contacting the interior surfaces with the plasma until the interior surfaces are coated with a fluorinated silicon oxide film, the $SiF_4$ and oxygen being supplied into the reactor at a gas flow ratio effective for maintaining compressive stress of the fluorinated silicon oxide film at 200 MPa or below, the deposition gas mixture including 80 to 200 sccm $SiF_4$ and 150 to 400 sccm $O_2$ supplied to the reactor in a gas flow ratio $O_2:SiF_4$ of 1.7 to 3.2, wherein the fluorinated silicon oxide film is deposited at a rate of at least 5000 Å/min.

17. A process of depositing a fluorinated silicon oxide precoat on interior reactor surfaces of a plasma CVD reactor wherein substrates are processed, the process comprising:

precoating the interior surfaces with fluorinated silicon oxide, the precoating being carried out by introducing a deposition gas mixture comprising $SiF_4$ and oxygen into the reactor, activating one or more components of the deposition gas mixture into a plasma state, and contacting the interior surfaces with the plasma until the interior surfaces are coated with a fluorinated silicon oxide film, the $SiF_4$ and oxygen being supplied into the reactor at a gas flow ratio effective for maintaining compressive stress of the fluorinated silicon oxide film at 200 MPa or below the deposition gas mixture including 80 to 200 sccm $SiF_4$ and 150 to 400 sccm $O_2$ supplied to the reactor in a gas flow ratio $O_2:SiF_4$ of 1.7 to 2.5, wherein the fluorinated silicon oxide film is deposited at a rate of at least 5000 Å/min.

* * * * *